(12) United States Patent
Yatskov

(10) Patent No.: US 10,834,847 B1
(45) Date of Patent: Nov. 10, 2020

(54) APPARATUS, SYSTEM, AND METHOD FOR INCREASING THE COOLING EFFICIENCY OF COLD PLATE DEVICES

(71) Applicant: Juniper Networks, Inc., Sunnyvale, CA (US)

(72) Inventor: Alexander I. Yatskov, Manchester, MA (US)

(73) Assignee: Juniper Networks, Inc, Sunnyvale, CA (US)

( * ) Notice: Subject to any disclaimer, the term of this patent is extended or adjusted under 35 U.S.C. 154(b) by 255 days.

(21) Appl. No.: 15/935,464

(22) Filed: Mar. 26, 2018

(51) Int. Cl.
*H05K 7/20* (2006.01)
*H05K 1/02* (2006.01)
*H01L 23/473* (2006.01)
*H01L 23/367* (2006.01)
*H01L 23/40* (2006.01)

(52) U.S. Cl.
CPC ..... *H05K 7/20254* (2013.01); *H01L 23/3672* (2013.01); *H01L 23/473* (2013.01); *H05K 1/0203* (2013.01); *H05K 7/20436* (2013.01); *H05K 7/20509* (2013.01); *H01L 23/4006* (2013.01); *H01L 2023/4062* (2013.01); *H01L 2023/4087* (2013.01); *H05K 2201/064* (2013.01)

(58) Field of Classification Search
CPC ....... G06F 1/181–182; H05K 7/20218–20381; H05K 7/20409–20418; H05K 7/20009–202; H05K 1/181; H05K 1/0203; H05K 7/20154; H05K 7/20254; H05K 7/20272; H05K 7/20436; H05K 7/20509; H05K 2201/064; H05K 2201/066; H05K 2201/10522; H05K 7/20627–20636; H05K 7/20633–20672; H05K 7/20763–20772; H05K 7/208–20809; H05K 7/20872–20881; H05K 7/20927–20936; H05K 1/0201–0203; H01L 23/367–3677; H01L 23/473; H01L 23/46–467; H01L 23/3672; H01L 23/467; H01L 23/4006; H01L 2023/4062; H01L 2023/4087
See application file for complete search history.

(56) References Cited

U.S. PATENT DOCUMENTS

| | | | | |
|---|---|---|---|---|
| 7,143,816 B1 * | 12/2006 | Ghosh | ................ | H01L 23/473 165/80.4 |
| 8,644,021 B2 * | 2/2014 | Chen | ................ | F28D 15/0275 165/80.4 |
| 9,313,921 B2 * | 4/2016 | Brunschwiler | ....... | H01L 23/367 |
| 9,482,472 B2 * | 11/2016 | Hwang | ................ | F28F 3/02 |
| 9,661,784 B2 * | 5/2017 | Arvelo | ................ | H01L 23/34 |
| 9,795,058 B2 * | 10/2017 | Tsai | ................ | H05K 7/20272 |
| 10,160,072 B2 * | 12/2018 | Boday | ................ | B23P 15/26 |

(Continued)

*Primary Examiner* — Zachary Pape
(74) *Attorney, Agent, or Firm* — FisherBroyles, LLP

(57) ABSTRACT

The disclosed apparatus may include (1) a cold plate base that (A) is thermally coupled to a component and (B) includes a set of heatsink fin structures that facilitate absorbing heat generated by the component and (2) a cold plate cover that (A) sits atop the cold plate base and (B) directs a cooling fluid across the set of heatsink fin structures to cool the cold plate base despite the heat absorbed by the cold plate base from the component. Various other apparatuses, systems, and methods are also disclosed.

15 Claims, 11 Drawing Sheets

(56) References Cited

U.S. PATENT DOCUMENTS

| | | | | |
|---|---|---|---|---|
| 10,499,542 | B2* | 12/2019 | Takemura | H01L 23/4006 |
| 2008/0029260 | A1* | 2/2008 | Hu | F28F 3/027 |
| | | | | 165/182 |
| 2012/0175094 | A1* | 7/2012 | Rice | F28D 1/03 |
| | | | | 165/170 |
| 2014/0158324 | A1* | 6/2014 | Tochiyama | H01L 23/473 |
| | | | | 165/67 |
| 2015/0121701 | A1* | 5/2015 | Loong | F28F 3/022 |
| | | | | 29/890.035 |
| 2015/0366105 | A1* | 12/2015 | Dunwoody | H05K 7/20509 |
| | | | | 165/76 |
| 2017/0045306 | A1* | 2/2017 | Tsai | H01L 23/473 |
| 2018/0209749 | A1* | 7/2018 | Wright | F28F 3/02 |
| 2018/0320993 | A1* | 11/2018 | Parag | F28F 3/12 |
| 2018/0356159 | A1* | 12/2018 | Bergh | F28D 9/0006 |
| 2019/0242625 | A1* | 8/2019 | Annapragada | F25B 21/00 |
| 2019/0384366 | A1* | 12/2019 | Tsai | H01L 23/473 |

* cited by examiner

US 10,834,847 B1

APPARATUS, SYSTEM, AND METHOD FOR INCREASING THE COOLING EFFICIENCY OF COLD PLATE DEVICES

Cold plates are often used to meet the thermal demands of today's high-power electronics. Cold plates are a thermal management technology that often involves a heat transfer interface cooled by a cold flowing fluid. While this cold flowing fluid potentially improves the heat transfer capabilities of the interface, traditional cold plate technology may still suffer from certain deficiencies and/or shortcomings.

For example, a traditional cold plate may be too large and/or cumbersome to meet the size and/or design constraints of certain computing devices with limited available space. As another example, to reach peak performance, a traditional cold plate may necessitate a high amount of fluid flow across the heat transfer interface. Unfortunately, the fluid flow may require a lot of electricity, thereby potentially driving up energy costs for users operating computing devices that implement such cold plate technology.

The instant disclosure, therefore, identifies and addresses a need for additional and improved apparatuses, systems, and methods for increasing the cooling efficiency of cold plate devices.

SUMMARY

As will be described in greater detail below, the instant disclosure generally relates to apparatuses, systems, and methods for increasing the cooling efficiency of cold plate devices. In one example, an apparatus for accomplishing such a task may include (1) a cold plate base that (A) is thermally coupled to a component and (B) includes a set of heatsink fin structures that facilitate absorbing heat generated by the component and (2) a cold plate cover that (A) sits atop the cold plate base and (B) directs a cooling fluid across the set of heatsink fin structures to cool the cold plate base despite the heat absorbed by the cold plate base from the component.

Similarly, a two-phase cooling system incorporating the above-described apparatus may include (1) a circuit that includes at least one component, (2) a cold plate base that (A) is thermally coupled to the component and (B) includes a set of heatsink fin structures that facilitate absorbing heat generated by the component, and (3) a cold plate cover that (A) sits atop the cold plate base and (B) directs a cooling fluid across the set of heatsink fin structures to cool the cold plate base despite the heat absorbed by the cold plate base from the component.

A corresponding method may include (1) thermally coupling, to a component, a cold plate base that (A) includes a set of heatsink fin structures that facilitate absorbing heat generated by the component and (B) forms a channel that sits between the set of heatsink fin structures, (2) mating a cold plate cover with the cold plate base that is thermally coupled to the component, and (3) directing the cooling fluid into the cold plate cover such that the cooling fluid flows over the set of heatsink fin structures to cool the cold plate base despite the heat absorbed by the cold plate base from the component.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
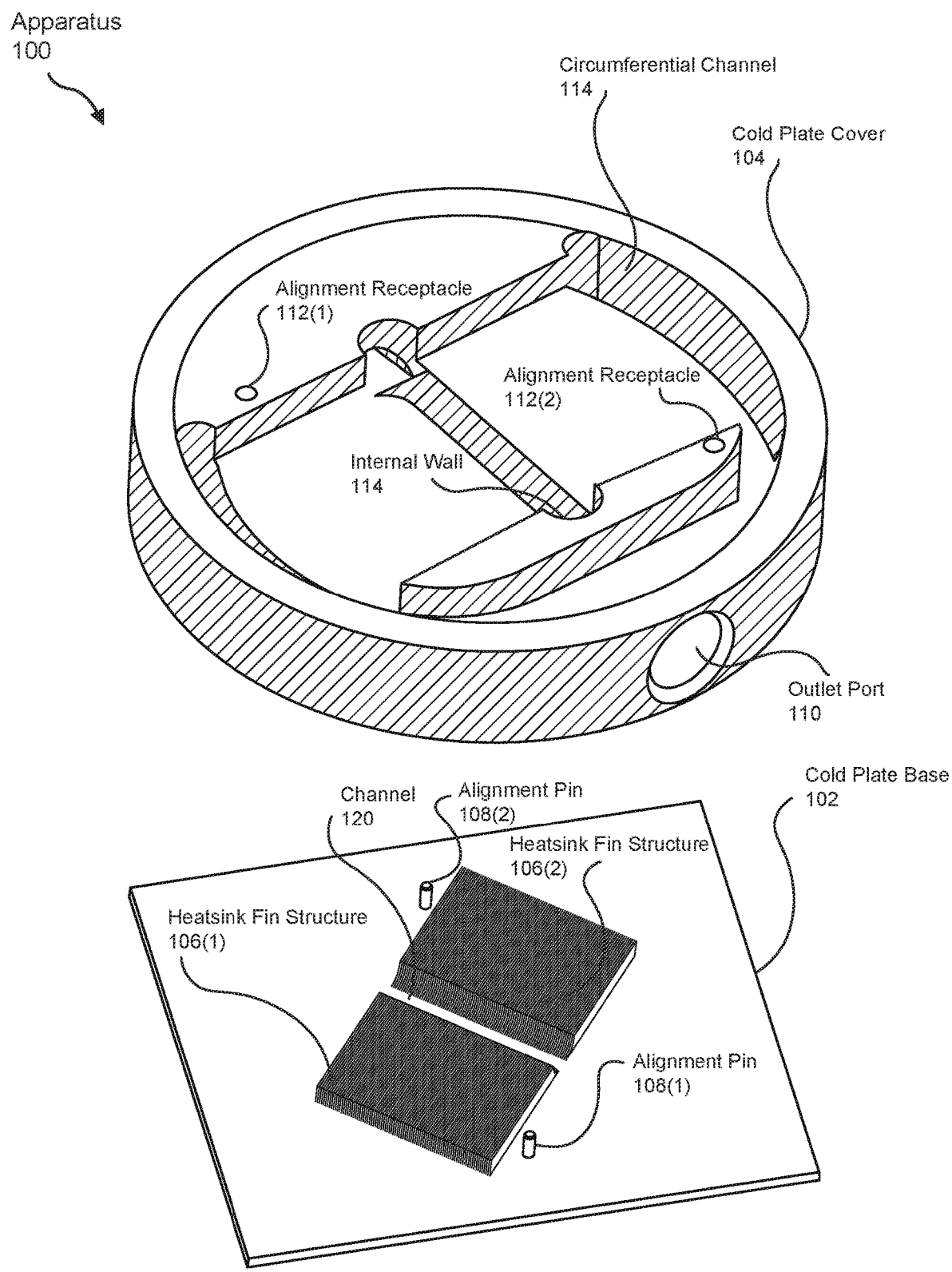
FIG. 1 is an illustration of an exemplary apparatus for improving the cooling efficiency of cold plate devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for increasing the cooling efficiency of cold plate devices. As will be explained in greater detail below, embodiments of the instant disclosure may reduce the size requirements of cold plate designs and/or enable cold plate designs to fit within smaller, tighter spaces. By doing so, these embodiments may help reduce the overall size and/or spatial impact or requirements of computing devices that implement cold plate technology.

Additionally or alternatively, embodiments of the instant disclosure may help optimize cold plate technology by absorbing, transferring, and/or rejecting the greatest amount of heat with the smallest physical design and/or layout. Moreover, embodiments of the instant disclosure may reduce the energy costs resulting from the operation and/or maintenance of computing devices that implement cold plate technology.

The following will provide, with reference to FIGS. 1-10, detailed descriptions of an exemplary apparatuses and corresponding implementations for increasing the cooling efficiency of cold plate devices. In addition, the discussion corresponding to FIG. 11 will provide a detailed description of an exemplary method for increasing the cooling efficiency of cold plate devices.

FIG. 1 illustrates an exemplary apparatus 100 for increasing the cooling efficiency of cold plate devices. As illustrated in FIG. 1, exemplary apparatus 100 may include and/or represent a cold plate base 102 and a cold plate cover 104. Together, cold plate base 102 and/or cold plate cover 104 may form and/or represent all or a portion of a cold plate. As will be described in greater detail below, this cold plate may serve as a two-phase cooling system that absorbs heat and/or transfers heat away from at least one component of a computing device.

As illustrated in FIG. 1, cold plate base 102 may include various features that contribute to and/or facilitate the cold plate's cooling capabilities. For example, cold plate base 102 may include a set of heatsink fin structures 106(1) and 106(2) that effectively form a channel 120. In addition, cold plate base 102 may include a set of alignment pins 108(1) and 108(2) that extend perpendicularly from cold plate base 102 and facilitate mating and/or aligning cold plate base 102 and cold plate cover 104 with one another.

Similarly, cold plate cover 104 may include various features that contribute to and/or facilitate the cold plate's cooling capabilities. For example, cold plate cover 104 may include at least one inlet port (not explicitly visible in FIG. 1 due to the perspective illustrated) and/or at least one outlet port 110 that collectively facilitate the flow of cooling fluid into, through, and/or out of the cold plate. In addition, cold plate cover 104 may include an internal wall 114 that causes cooling fluid to accumulate in channel 120 of the cold plate and then flow in opposite directions over heatsink fin structures 106(1) and 106(2), respectively. Cold plate cover 104 may also include a set of alignment receptacles 112(1) and 112(2) that are fitted to accept alignment pins 108(1) and 108(2), respectively, and facilitate mating and/or aligning cold plate base 102 and cold plate cover 104 with one another.

Cold plate base 102 generally represent any type or form of heatsink plate that conducts, transfers, absorbs, and/or sinks heat. In one example, cold plate base 102 may serve as a heat transfer interface that makes contact with a component of a computing device for the purpose of conducting, transferring, absorbing, and/or sinking heat generated by the component. Accordingly, cold plate base 102 may effectively cool the component of the computing device. In this example, while cold plate base 102 may cool the component of the computing device, cold plate base 102 may also itself be cooled by cooling fluid that flows through the cold plate, thus demonstrating and/or achieving the cold plate's two-phase cooling functionality.

Cold plate base 102 may be of various shapes and/or dimensions. In some examples, cold plate base 102 may form a square and/or a rectangle. Additional examples of shapes formed by cold plate base 102 include, without limitation, ovals, circles, triangles, diamonds, parallelograms, variations or combinations of one or more of the same, and/or any other suitable shapes.

In some examples, cold plate base 102 may be sized in a particular way to maximize the amount of heat transferred from the component and/or fit within a certain space. In one example, cold plate base 102 may run the length of one side of the component. Additionally or alternatively, cold plate base 102 may include and/or incorporate a Thermal Interface Material (TIM) on the surface that makes contact with the component.

Cold plate base 102 may include and/or contain a variety of thermally conductive materials. In one example, cold plate base 102 may be made of copper. Additional examples of such thermally conductive materials include, without limitation, aluminum, diamond, alloys, combinations or variations of one or more of the same, and/or any other suitable materials.

Heatsink fin structures 106(1) and 106(2) generally represent any type or form of finned configuration or design that extends the surface area of a cold plate base. In some examples, heatsink fin structures 106(1) and 106(2) may each include an array of skived fins that are thermally coupled to one another on cold plate base 102. In one example, heatsink fin structures 106(1) and 106(2) may each appear and/or serve as a series of thermally conductive folds and/or skived fins atop and/or incorporated into cold plate base 102.

Heatsink fin structures 106(1) and 106(2) may each be of various shapes and/or dimensions. In some examples, heatsink fin structures 106(1) and 106(2) may each form a square and/or a rectangle. In one example, the fins included in heatsink fin structures 106(1) and 106(2) may be angled (by, e.g., a few degrees) to accommodate manufacturing variations and/or tolerances between cold plate base 102 and cold plate cover 104. In other words, the fins included in heatsink fin structures 106(1) and 106(2) may be inclined at a non-right angle to accommodate the worst-case tolerances of cold plate base 102 and cold plate cover 104. These inclined heatsink fins may be specifically designed to sustain and/or accommodate the weight of cold plate cover 104 due to the thermally conductive material (e.g., copper) softening in a vacuum brazing oven.

For example, rather than standing completely vertically and/or straight (at, e.g., a 90-degree angle) with respect to the base plate, the fins included in heatsink fin structures 106(1) and 106(2) may be angled at 87 degrees to ensure that cold plate base 102 and cold plate cover 104 mate and/or fit together properly despite certain manufacturing variations and/or gap tolerances. Additionally or alternatively, the fins included in heatsink fin structures 106(1) and 106(2) may be arranged and/or disposed across cold plate base 102 in parallel to one another.

In some examples, heatsink fin structures 106(1) and 106(2) may be sized in a particular way to fit properly inside cold plate cover 104. In one example, when cold plate base 102 and cold plate cover 104 are mated together, heatsink fin structures 106(1) and 106(2) may be enclosed and/or encapsulated within the resulting cold plate. Additionally or alternatively, heatsink fin structures 106(1) and 106(2) may have the same height as the corresponding gap and/or opening in cold plate cover 104.

Heatsink fin structures 106(1) and 106(2) may include and/or contain a variety of thermally conductive materials. In one example, heatsink fin structures 106(1) and 106(2) may be made of copper. Additional examples of such thermally conductive materials include, without limitation, aluminum, diamond, alloys, combinations or variations of one or more of the same, and/or any other suitable materials.

Alignment pins 108(1) and 108(2) generally represent any type or form of physical material, structure, and/or support feature that holds and/or aligns a cold plate cover in a specific position when placed atop a cold plate base. In one example, alignment pins 108(1)-(N) may each include and/or represent physical member and/or peg capable of supporting and/or maintaining cold plate cover 104 in place on cold plate base 102.

Alignment pins 108(1) and 108(2) may each include and/or form any suitable shape. In some examples, alignment pins 108(1) and 108(2) may form a square, a circle, an oval, a cube, a cylinder, portions of one or more of the same, and/or variations or combinations of one or more of the same. In one example, alignment pins 108(1) and 108(2) may each be incorporated into and/or formed by cold plate base 102 itself. Additionally or alternatively, cold plate base 102 may include and/or form holes through which alignment pins 108(1) and 108(2) are able to pass. For example, alignment pins 108(1) and 108(2) may form and/or represent part of a mount plate (e.g., mount plate 302 in FIG. 3). In this example, alignment pins 108(1) and 108(2) may pass through holes in cold plate base 102 to support and/or align cold plate cover 104 with respect to cold plate base 102.

Alignment pins 102(1)-(N) may each include and/or contain any of a variety of materials. Examples of such materials include, without limitation, metals, plastics, ceramics, polymers, composites, combinations or variations of one or more of the same, and/or any other suitable materials. In addition, alignment pins 102(1)-(N) may each be of any suitable dimensions.

Channel 120 generally represents any type or form of groove and/or trench incorporated into and/or formed by or within a cold plate. In one example, channel 120 may run through cold plate base 102 and/or be formed at least in part by heatsink fin structures 106(1) and 106(2). Accordingly, channel 120 may reside and/or sit between heatsink fin structures 106(1) and 106(2). In addition, channel 120 may direct and/or control at least a portion of the flow path of cooling fluid within the cold plate. In one example, the cooling fluid may flow through channel 120 as the cooling fluid enters the inlet port. In other words, channel 120 may represent the first leg of the fluid's flow path upon entry into the cold plate.

In some examples, channel 120 may run through a central plane of cold plate base 102. As will be described in greater detail below, channel 120 may accumulate cooling fluid that presses against an internal wall of cold plate cover 104. The resulting pressure and/or resistance from that internal wall may cause the cooling fluid to flow over heatsink fin structures 106(1) and 106(2) in opposite directions, thereby cooling heatsink fin structures 106(1) and 106(2) and/or cool plate base 102.

Cold plate cover 104 generally represents any type or form of covering, enclosure, and/or turret that covers and/or encloses a cold plate base. In some examples, cold plate cover 104 may mate and/or physically connect with cold plate base 102. Like cold plate base 102, cold plate cover 104 may conduct, transfer, absorb, and/or sink heat generated by a component thermally coupled to cold plate base 102. Accordingly, cold plate cover 104 may also serve to cool the component. In this example, while cold plate cover 104 may serve to cool the component, cold plate cover 104 may also itself be cooled by cooling fluid that flows through the cold plate, thus achieving and/or demonstrating the cold plate's two-phase cooling functionality.

Cold plate cover 104 may be of various shapes and/or dimensions. In some examples, cold plate cover 104 may form a circle, an oval, a square, a rectangle, and/or a cube. Additional examples of shapes formed by cold plate cover 104 include, without limitation, triangles, diamonds, parallelograms, variations or combinations of one or more of the same, and/or any other suitable shapes.

In some examples, cold plate cover 104 may be sized in a particular way to maximize the amount of heat transferred from the component and/or fit within a certain space. In one example, cold plate cover 104 may be sized to cover and/or enclose heatsink fin structure 106(1) and 106(2). In this example, the size of cold plate cover 104 may be limited to the amount of space necessary to cover and/or enclosure heatsink fin structure 106(1) and 106(2). Additionally or alternatively, cold plate cover 104 may include and/or incorporate a TIM along the surface that makes contact with cold plate base 102

Cold plate cover 104 may include and/or contain a variety of thermally conductive materials. In one example, cold plate cover 104 may be made of copper. Additional examples of such thermally conductive materials include, without limitation, aluminum, diamond, alloys, combinations or variations of one or more of the same, and/or any other suitable materials.

In some examples, cold plate base 102 and cold plate cover 104 may represent and/or be manufactured as individual pieces and/or units that, when mated together, form a cold plate. In other examples, cold plate base 102 and cold plate cover 104 may represent and/or be manufactured as a single inseparable piece and/or unit that itself constitutes a cold plate.

Circumferential channel 114 generally represents to any type or form of groove and/or trench incorporated into and/or formed by or within a cold plate. In some examples, circumferential channel 114 may run through and/or be formed by cold plate cover 104. In one example, circumferential channel 114 may run along a perimeter and/or circumference of cold plate cover 104. Circumferential channel 114 may direct and/or control at least a portion of the flow path of cooling fluid within the cold plate.

In one example, upon traversing over heatsink fin structures 106(1) and 106(2), the cooling fluid may flow through circumferential channel 114 to exit the cold plate via outlet port 110. In other words, circumferential channel 114 may represent the last leg of the fluid's flow path prior to exiting the cold plate. In some examples, circumferential channel 114 may form a somewhat rounded shape, such as an arc and/or a semicircle.

Alignment receptacles 112(1) and 112(2) each generally represent any type or form of housing, hole, and/or opening designed to accept and/or hold a corresponding alignment pin. In one example, alignment receptacles 112(1) and 112(2) may each be formed by and/or incorporated into cold plate cover 104. In this example, alignment receptacles 112(1) and 112(2) may line up with and be sized to accept alignment pins 108(1) and 108(2), respectively. Accordingly, alignment pins 108(1) and 108(2) may fit inside alignment receptacles 112(1) and 112(2), respectively, and serve to align cold plate base 102 and cold plate cover 104 with respect to one another. Together, alignment pins 108(1) and 108(2) and alignment receptacles 112(1) and 112(2) may support and/or maintain cold plate base 102 and cold plate cover 104 in the proper mated position.

In some examples, cold plate base 102 may be thermally coupled to a component. In such examples, cold plate base 102 may include heatsink fin structures 106(1) and 106(2) that facilitate absorbing heat generated by that component. In addition, cold plate cover 104 may sit atop cold plate base 102 and/or direct cooling fluid across heatsink fin structures 106(1) and 106(2) to cool cold plate base 102 despite the heat generated by the component.

Figure 2:
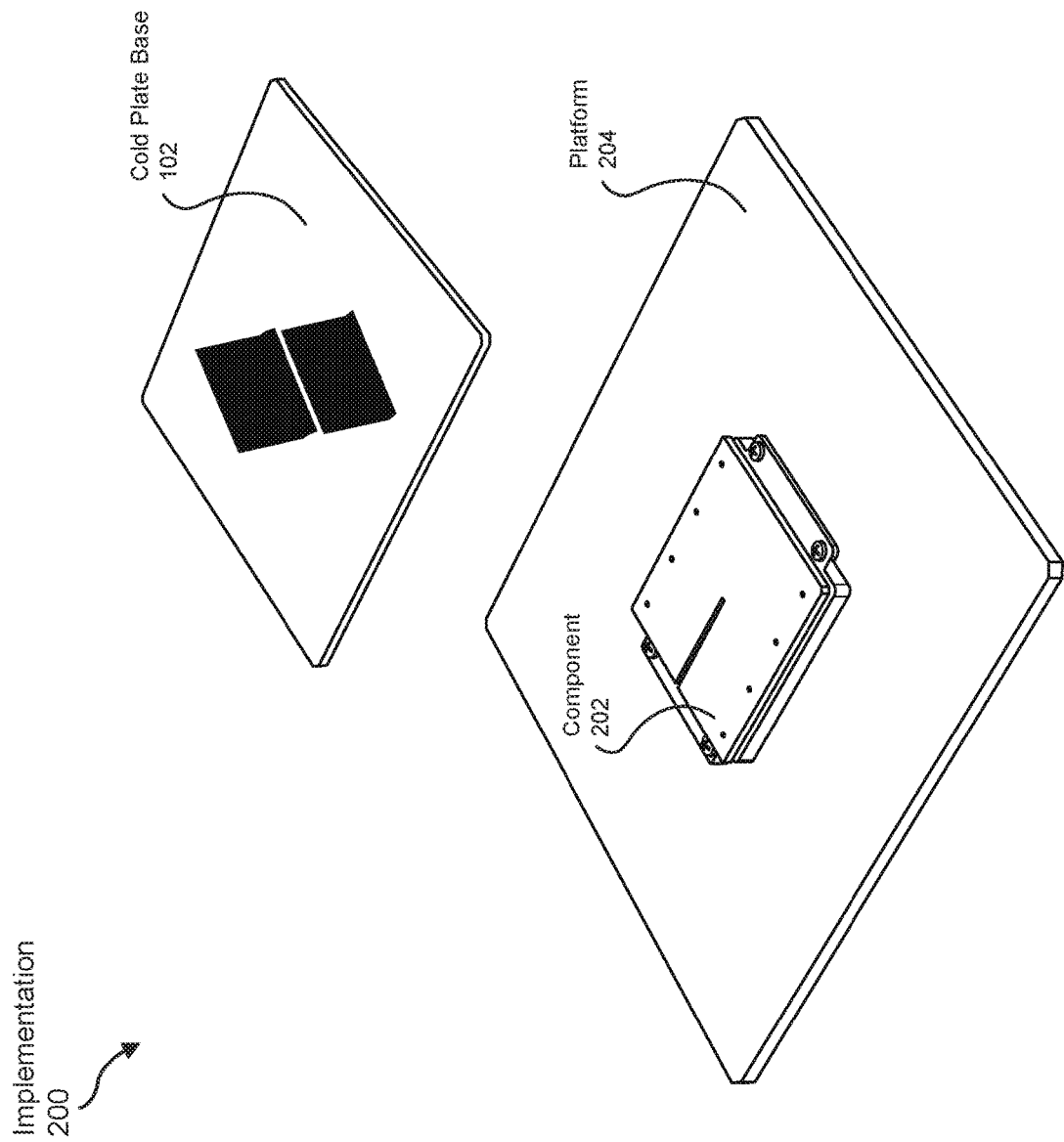
FIG. 2 is an illustration of an exemplary implementation of an apparatus for improving the cooling efficiency of cold plate devices.

FIG. 2 illustrates an exemplary implementation 200 for increasing the cooling efficiency of cold plate devices. As illustrated in FIG. 2, exemplary implementation 200 may involve cold plate base 102 and a component 202 attached to a platform 204. In some examples, component 202 may include and/or represent a high power electronic semiconductor device that is soldered to platform 204 (e.g., a printed circuit board).

Examples of component 202 include, without limitation, Application Specific Integrated Circuits (ASICs), Systems on a Chip (SoCs), lidless integrated circuits, microprocessors, microcontrollers, Central Processing Units (CPUs), Field-Programmable Gate Arrays (FPGAs), memory devices, High Bandwidth Memory (HBM), Random Access Memory (RAM), Read Only Memory (ROM), flash memory, caches, semiconductor dies, portions of one or more of the same, variations or combinations of one or more of the same, and/or any other suitable component. Examples of platform 204 include, without limitation, circuit boards (e.g., printed circuit boards), semiconductor substrates, wafers, variations or combinations of one or more of the same, and/or any other suitable platform.

In one example, cold plate base 102 may be thermally coupled to component 202. For example, cold plate base 102 may be placed, set, and/or secured atop component 202 such that cold plate base makes physical contact with component 202.

Figure 3:
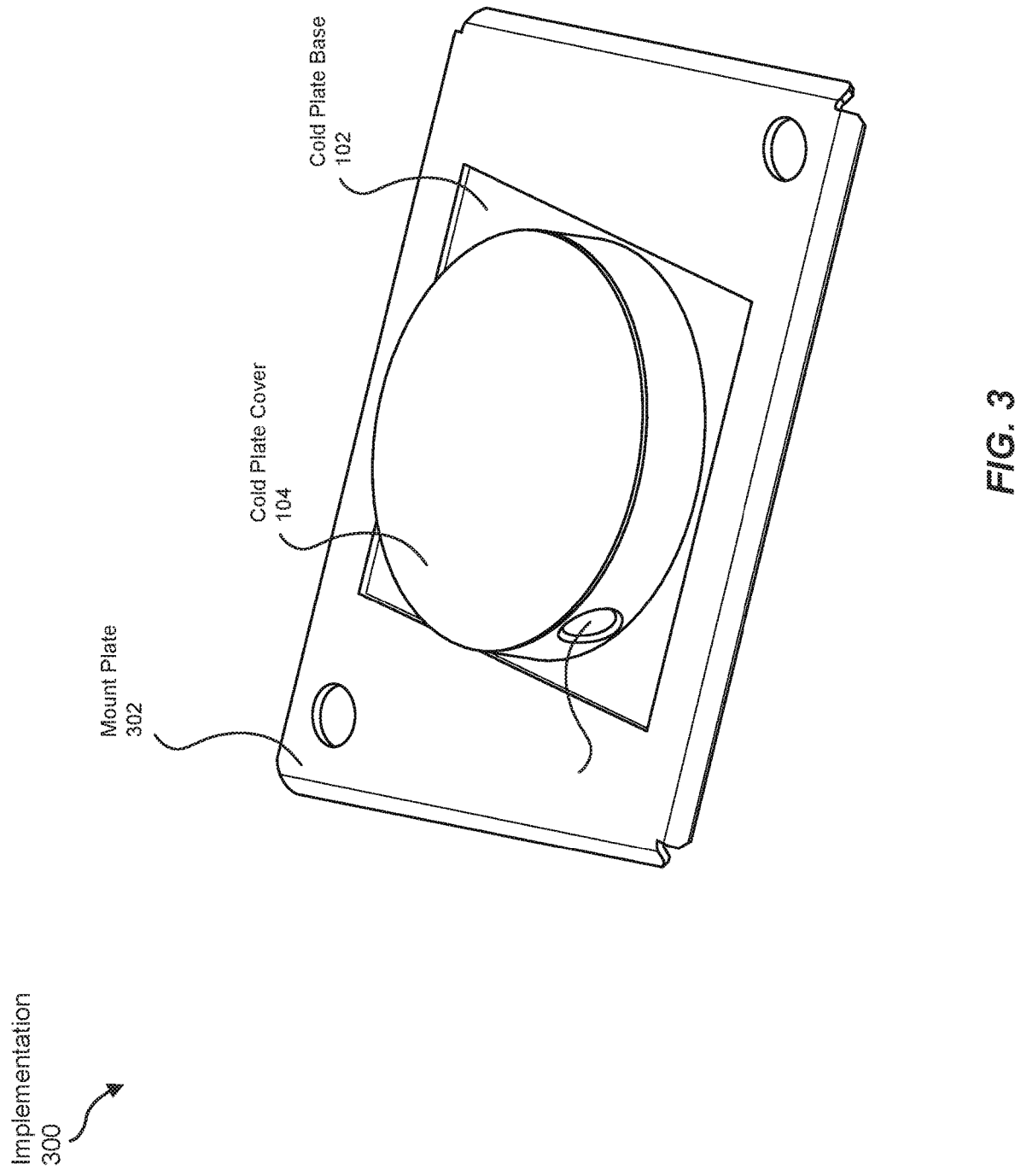
FIG. 3 is illustration of an exemplary implementation of an apparatus for improving the cooling efficiency of cold plate devices.

FIG. 3 illustrates an exemplary implementation 300 for increasing the cooling efficiency of cold plate devices. As illustrated in FIG. 3, exemplary implementation 300 may involve cold plate base 102 and cold plate cover 104, which are mated together to form a cold plate. In one example, cold plate base 102 may be placed and/or incorporated into a mount plate 302 in FIG. 3. In this example, mount plate 302 may enable cold plate base 102 to securely couple to component 202. In other words, mount plate 302 may attach to platform 204 such that cold plate base 102 and component 202 make physical contact with each other, thereby establishing a thermal couple.

Figure 4:
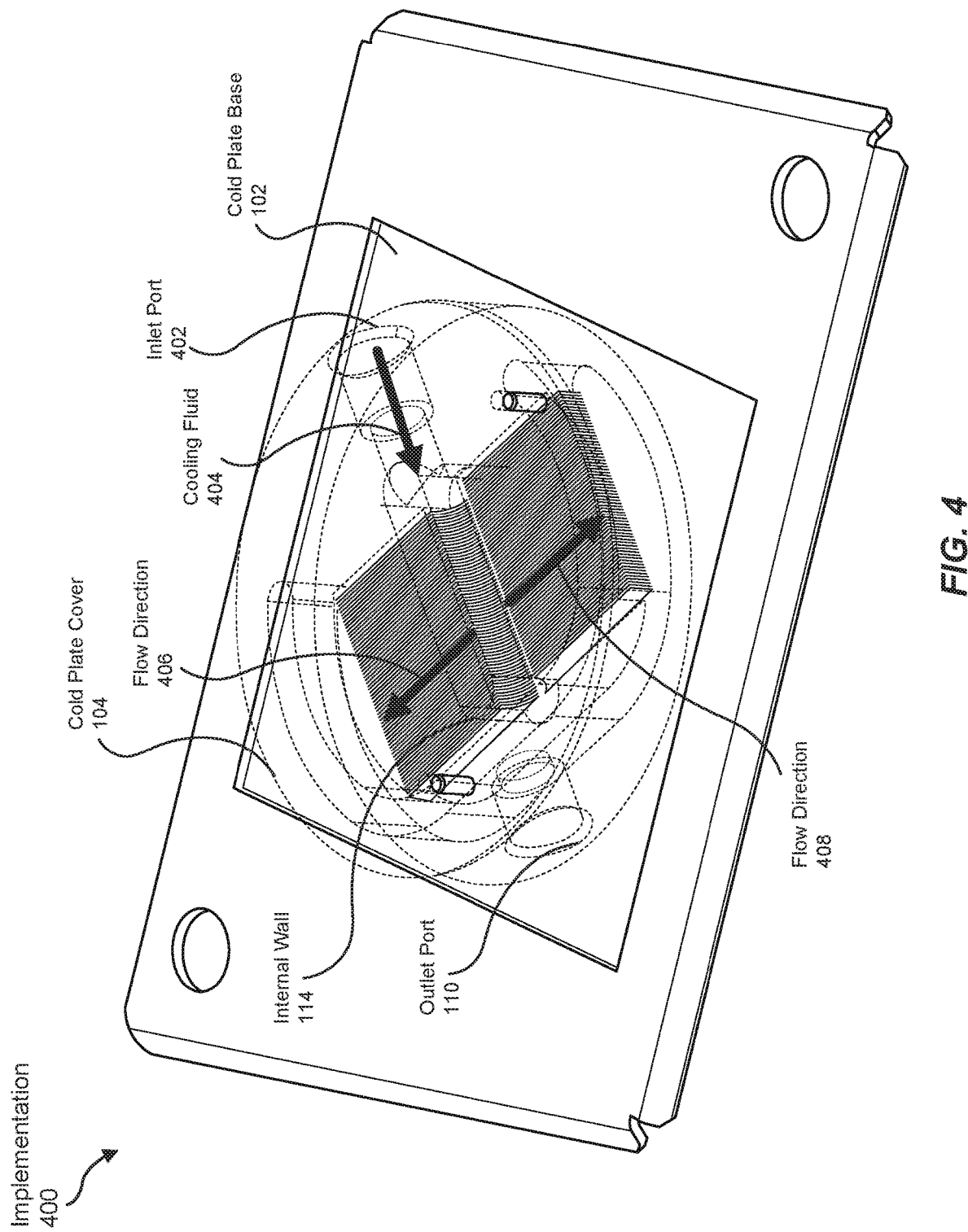
FIG. 4 is an illustration of an exemplary implementation of an apparatus for improving the cooling efficiency of cold plate devices.

FIG. 4 illustrates an exemplary implementation 400 for increasing the cooling efficiency of cold plate devices. As illustrated in FIG. 4, exemplary implementation 400 may involve directing and/or pumping cooling fluid 404 into cold plate cover 104 via inlet port 402. Various other features of the disclosed cold plate technology may also be visible in FIG. 4 but not explicitly labeled in FIG. 4.

Examples of cooling fluid 404 include, without limitation, liquids, gases, plasmas, vapors, variations or combinations of one or more of the same. Virtually any liquid may serve as cooling fluid 404. For example, cooling fluid 404 may include and/or represent water. In another example, cooling fluid 404 may include and/or represent a liquid refrigerant.

In one example, upon entering cold plate cover 104 via inlet port 402, cooling fluid 404 may flow into channel 120 (not explicitly labeled in FIG. 4) and press against internal wall 114. The pressure and/or resistance from internal wall 114 may cause cooling fluid 404 to build up and/or accumulate in channel 120 until cooling fluid 404 rises to the level and/or height of heatsink fin structures 106(1) and 106(2). At that point, the pressure may cause cooling fluid 404 to flow over heatsink fin structures 106(1) and 106(2) in flow directions 406 and 408, respectively, toward the outer perimeter and/or circumference of cold plate cover 104. After passing over heatsink fin structures 106(1) and 106(2), cooling fluid 404 may flow along circumferential channel 114 (not explicitly illustrated in FIG. 4) until exiting the cold plate via outlet port 110.

As illustrated in FIG. 4, flow directions 406 and 408 may be opposite of one another. Accordingly, while traversing through the cold plate, cooling fluid 404 may pass over only one of heatsink fin structures 106(1) and 106(2) instead of both. By passing over only one of these heatsink fin structures instead of both, the temperature of cooling fluid 404 may remain lower and decrease the cooling requirements and/or resulting energy costs of the cold plate. The split-flow design and/or layout may also mitigate and/or reduce the need for such high flow of cooling fluid through the cold plate. Thus, this new cold plate technology may represent a more energy-efficient and/or cost-effective way to cool components for peak performance when compared to traditional cold plate solutions.

In addition, the split-flow design may facilitate that the partial removal of material at the cold plate's inlet port area. As a result, this area may provide impingement-friendly conditions that support better and/or increased vapor bubble nucleation and heat transfer for the cold plate.

Figure 5:
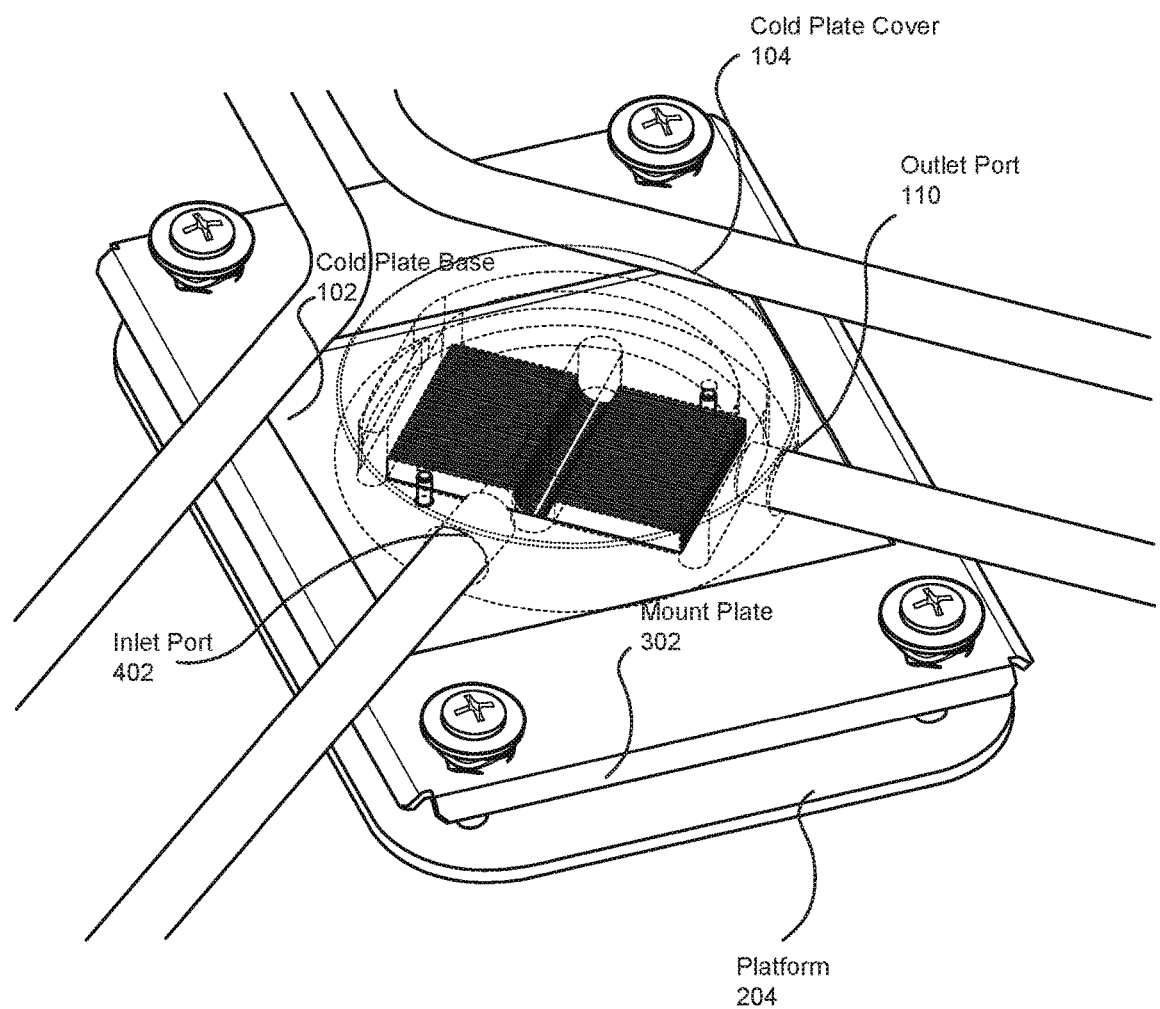
FIG. 5 is an illustration of an exemplary implementation of an apparatus for improving the cooling efficiency of cold plate devices.
Figure 6:
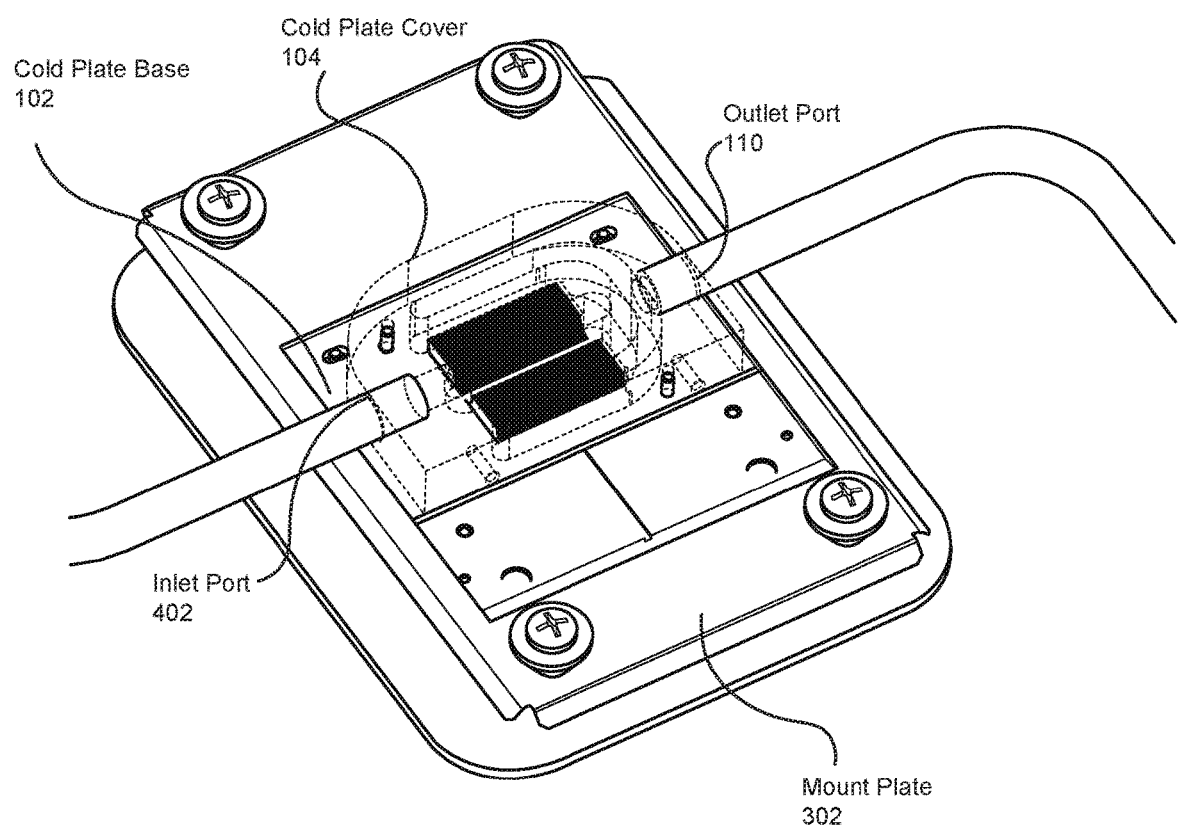
FIG. 6 is an illustration of an exemplary implementation of an apparatus for improving the cooling efficiency of cold plate devices.

FIGS. 5 and 6 illustrate exemplary implementations 500 and 600, respectively, for increasing the cooling efficiency of cold plate devices. As illustrated in FIGS. 5 and 6, exemplary implementations 500 and 600 may each involve cold plate base 102, cold plate cover 104 with inlet port 402 and outlet port 110, mount plate 302, and platform 204. Various other features of the disclosed cold plate technology may also be visible in FIGS. 5 and 6 but not explicitly labeled in FIGS. 5 and 6. Implementations 500 and 600 may represent specific views of different cold plate designs and/or interpretations that implement apparatus 100 in FIG. 1.

Figure 7:
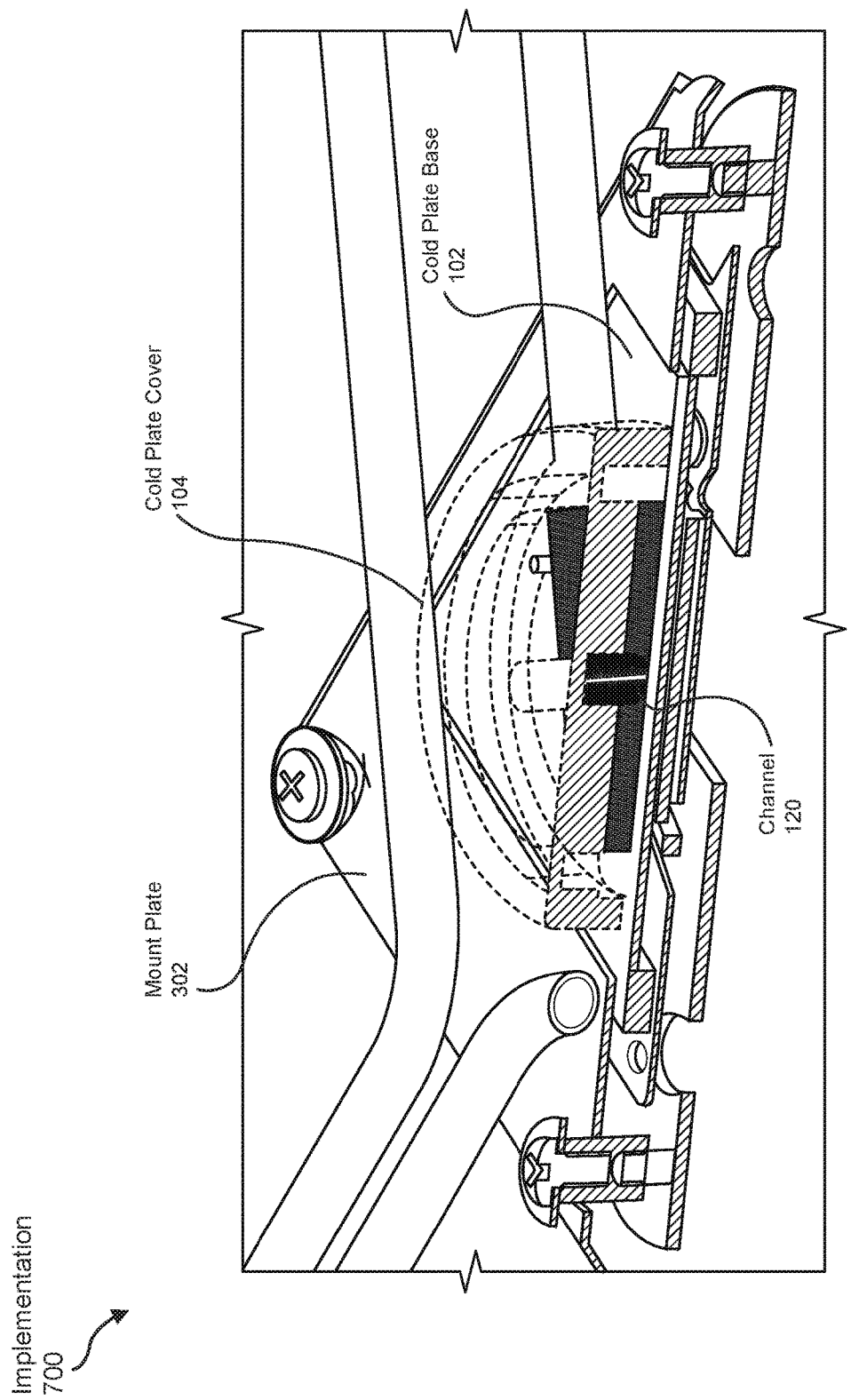
FIG. 7 is a cross-section illustration of an exemplary implementation of an apparatus for improving the cooling efficiency of cold plate devices.

FIG. 7 illustrates a cross section of an exemplary implementation 700 for increasing the cooling efficiency of cold plate devices. As illustrated in FIG. 7, exemplary implementation 700 may involve cold plate base 102, cold plate cover 104, and mount plate 302. Various other features of the disclosed cold plate technology may also be visible in FIG. 7 but not explicitly labeled in FIG. 7.

Figure 8:
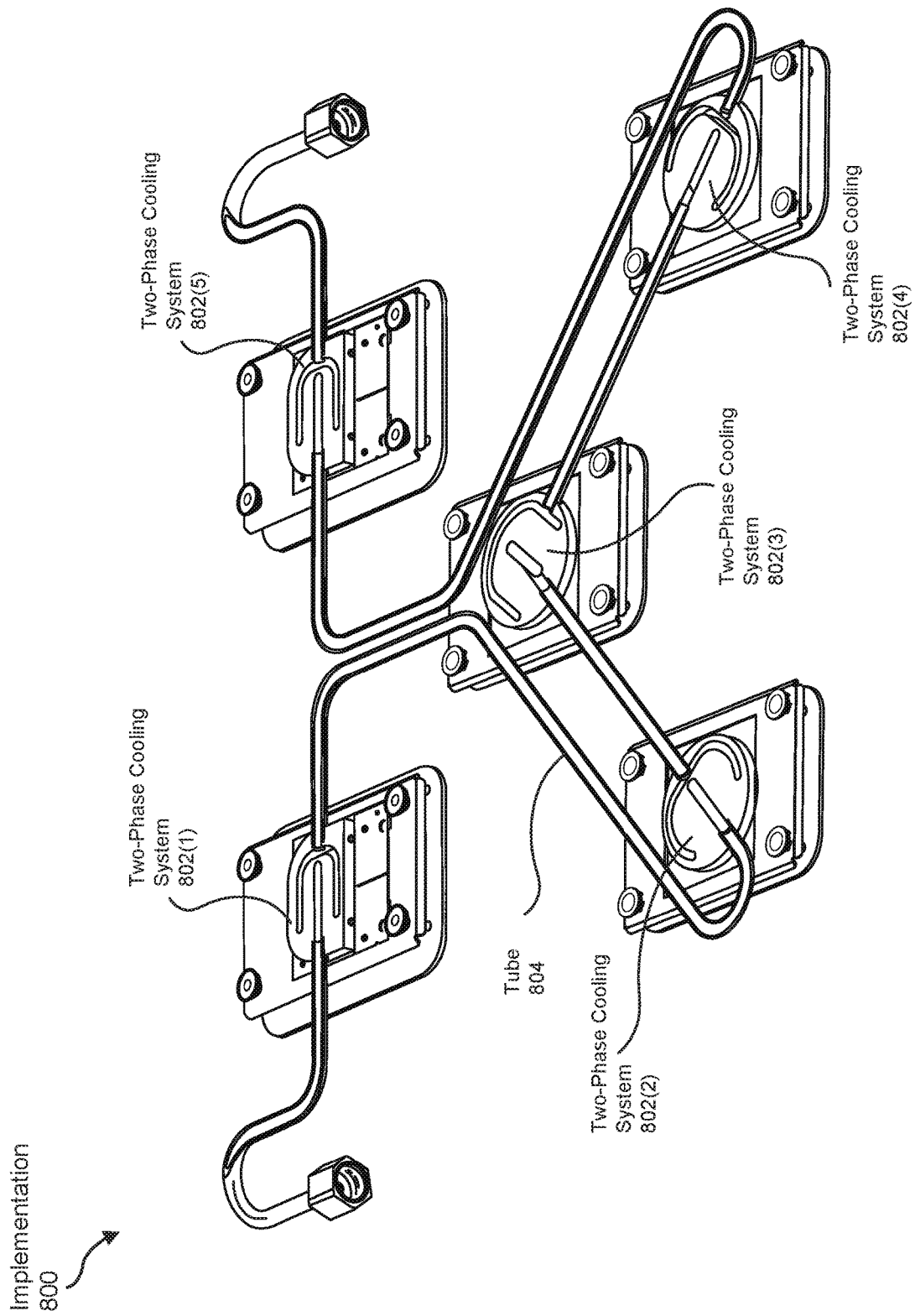
FIG. 8 is an illustration of an exemplary implementation of an apparatus for improving the cooling efficiency of cold plate devices.

FIG. 8 illustrates an exemplary implementation 800 for increasing the cooling efficiency of cold plate devices. As illustrated in FIG. 8, exemplary implementation 800 may involve two-phase cooling systems 802(1), 802(2), 802(3), 802(4), and 802(5) connected to one another in a daisy-chain layout by various tubes. In one example, a pump may inject and/or direct cooling fluid 404 into two-phase cooling systems 802(1)-(5) to facilitate the cooling of various components to which two-phase cooling systems 802(1)-(5) are thermally coupled. In this example, two-phase cooling system 802(1) may pass cooling liquid 404 to two-phase cooling system 802(2) via a tube 804. In other words, tube 804 may carry cooling liquid 404 from two-phase cooling system 802(1) to two-phase cooling system 802(2).

In one example, each of two-phase cooling systems 802(1)-(5) may include and/or represent a cold plate. For example, two-phase cooling systems 802(1) may include and/or represent cold plate base 102 and/or cold plate cover 104.

Figure 9:
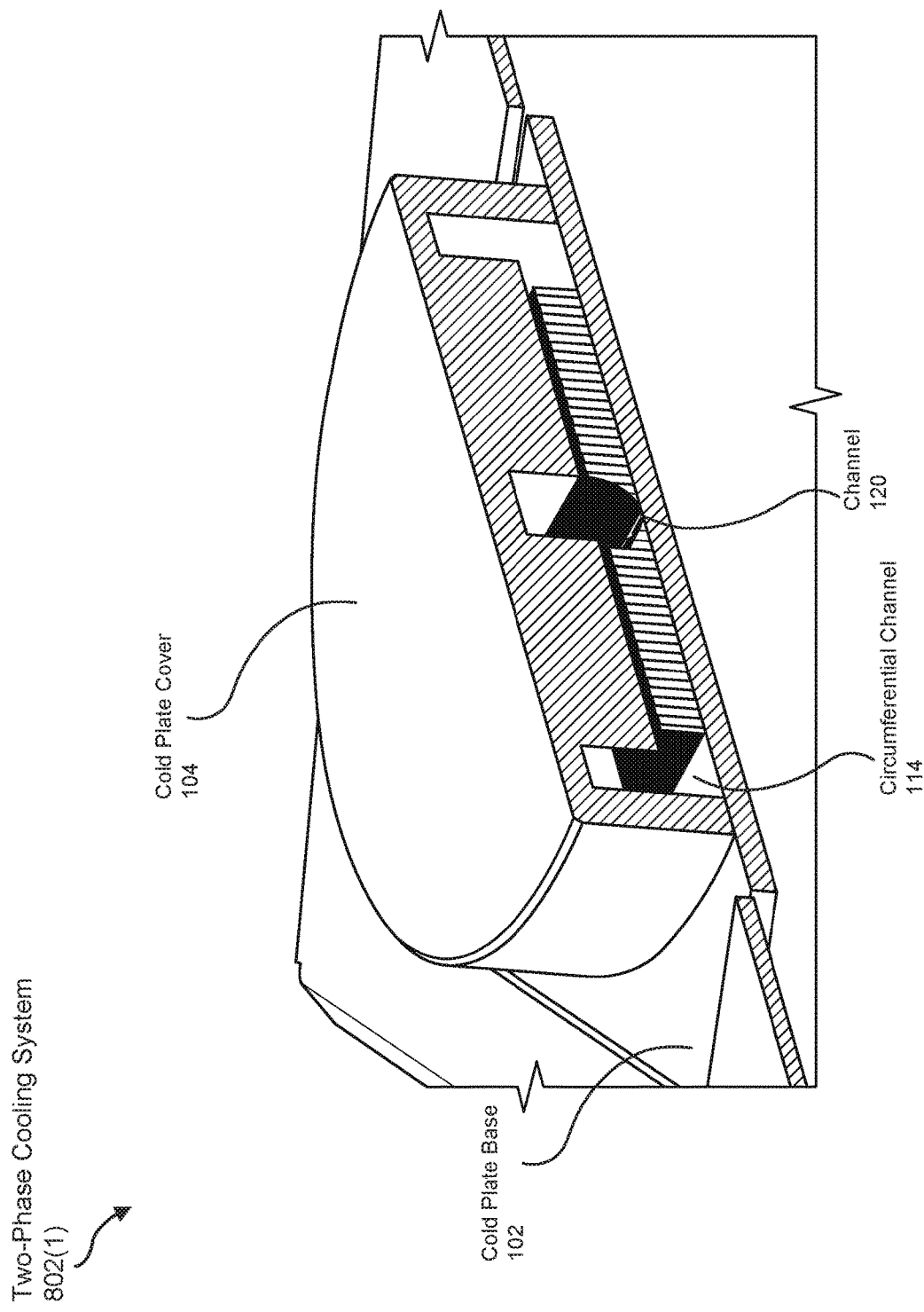
FIG. 9 is a cross-section illustration of an exemplary two-phase cooling system.

FIG. 9 illustrates a cross section of an exemplary implementation 900 for increasing the cooling efficiency of cold plate devices. As illustrated in FIG. 9, exemplary implementation 900 may involve cold plate base 102, cold plate cover 104, channel 120, and/or circumferential channel 114. Various other features of the disclosed cold plate technology may also be visible in FIG. 9 but not explicitly labeled in FIG. 9.

Figure 10:
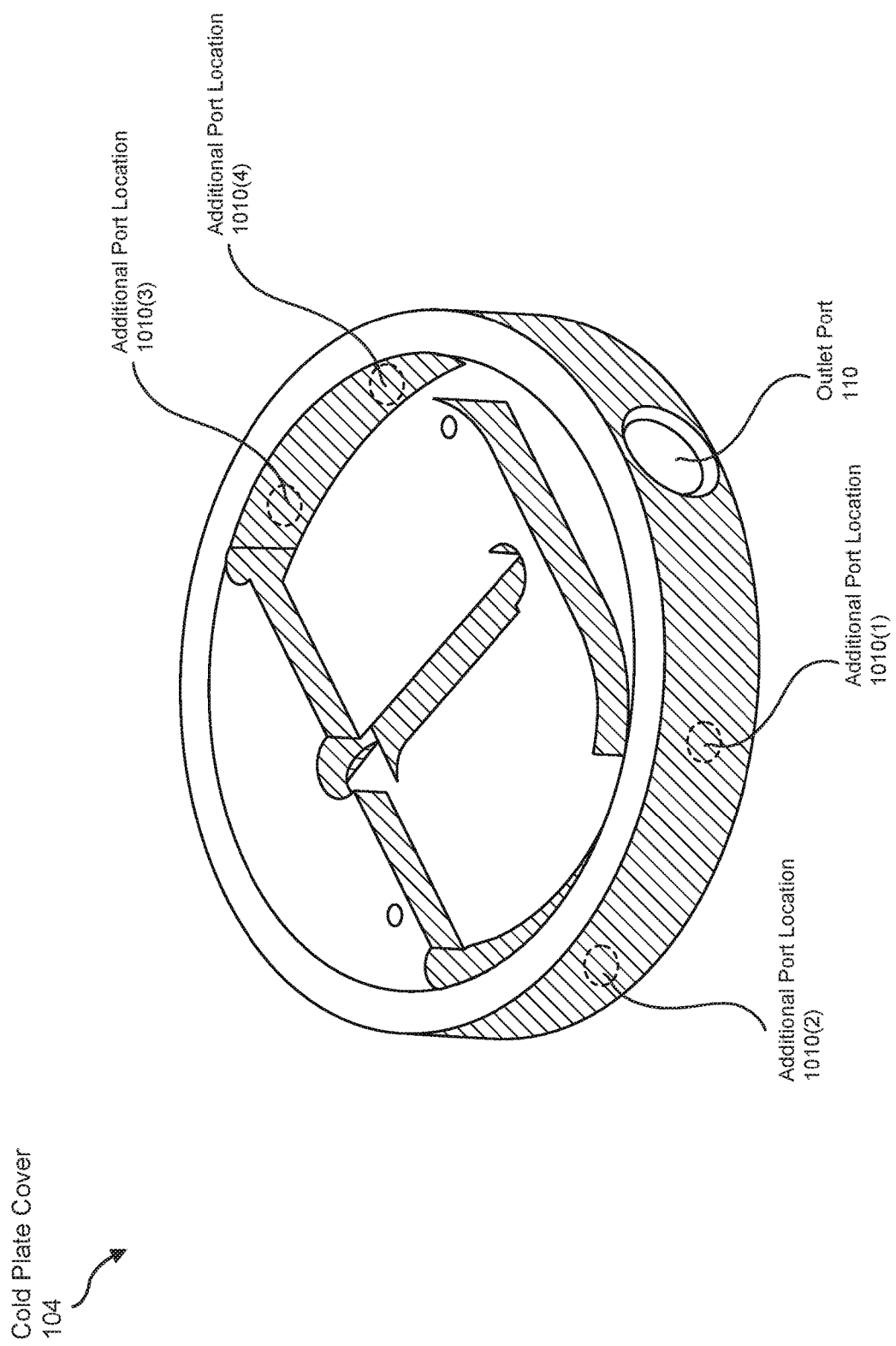
FIG. 10 is an illustration of an exemplary cold plate cover.

FIG. 10 illustrates an exemplary cold plate cover 104 for increasing the cooling efficiency of cold plate devices. As illustrated in FIG. 10, cold plate cover 104 may include and/or form multiple inlet ports and/or outlet ports. For example, beyond inlet port 402 and/or outlet port 110, cold plate cover 104 may also include and/or form an additional inlet port or outlet port at one or more of additional port location 1010(1), additional port location 1010(2), additional port location 1010(3), and/or additional port location 1010(4). By including and/or forming such additional inlet and/or outlet ports in this way, cold plate cover 104 may accommodate numerous connections and/or links to other cold plates and/or two-phase cooling systems. Accordingly, cold plate cover 104 may accommodate and/or support a very compact fluid distribution system and/or design.

Figure 11:
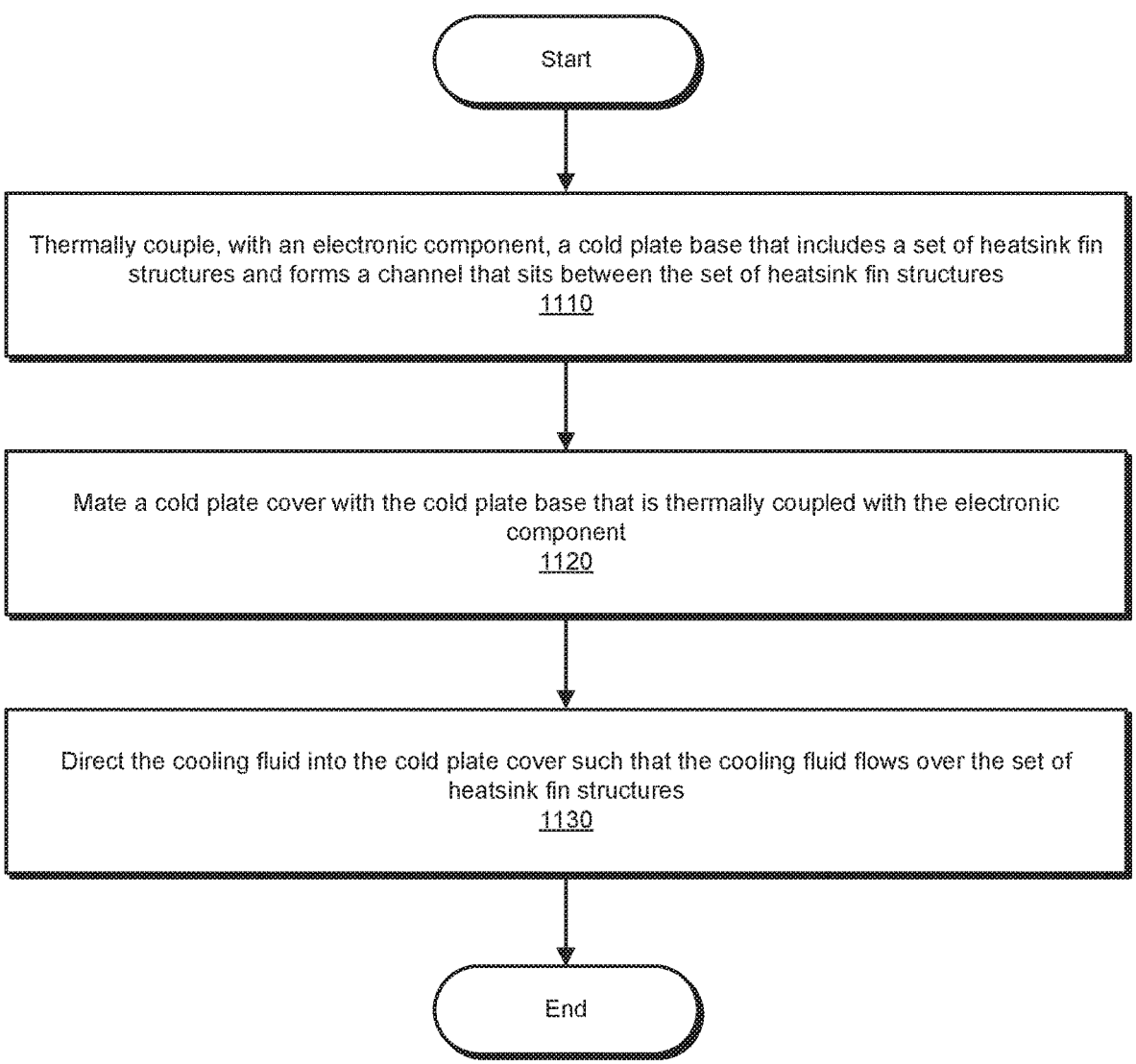
FIG. 11 is a flow diagram of an exemplary method for increasing the cooling efficiency of cold plate devices.

FIG. 11 is a flow diagram of an exemplary method 1100 for increasing the cooling efficiency of cold plate devices. Method 1100 may include the step of thermally coupling, with an electronic component, a cold plate base that includes a set of heatsink fin structures and forms a channel that sits between the set of heatsink fin structures (1110). Step 1110 may be performed in a variety of ways, including any of those described above in connection with FIGS. 1-10. For example, a computing equipment manufacturer or subcontractor may machine and/or assemble cold plate base 102. The computing equipment manufacturer or subcontractor may then apply and/or physically interface (whether manually or by way of automation) cold plate base 102 to an electronic component that generates heat.

Method 1100 may also include the step of mating a cold plate cover with the cold plate base that is thermally coupled to the electronic component (1120). Step 1120 may be performed in a variety of ways, including any of those described above in connection with FIGS. 1-10. For example, the computing equipment manufacturer or subcontractor may attach cold plate cover 104 to cold plate base 102 by properly aligning cold plate cover 104 over cold plate base 102 and then pressing down firmly. In this example, the alignment pins and receptacles may help secure cold plate base 102 and cold plate cover 104 together and/or hold them in place.

Method 1100 may further include the step of directing the cooling fluid into the cold plate cover such that the cooling fluid flows over the set of heatsink fin structures to cool the cold plate base despite the heat absorbed by the cold plate base from the component (1130). Step 1130 may be performed in a variety of ways, including any of those described above in connection with FIGS. 1-10. For example, the computing equipment manufacturer or subcontractor may connect, to cold plate cover 104, a pump and/or line that directs cooling fluid 404 into cold plate cover 104. This pump and/or line may then pump and/or feed cooling fluid 404 into cold plate cover 104.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
    a cold plate base that:
        is thermally coupled to a component;
        includes a first heatsink fin structure and a second heatsink fin structure that facilitate absorbing heat generated by the component; and
        forms a channel that sits between the first heatsink fin structure and the second heatsink fin structure; and
    a cold plate cover that:
        sits atop the cold plate base;
        includes at least one inlet port and at least one outlet port that collectively enable a cooling fluid to:
            enter the cold plate cover;
            pass over the first heatsink fin structure and the second heatsink fin structure included on the cold plate base; and
            exit the cold plate cover;
        directs the cooling fluid from the inlet port to the channel;
        includes an internal wall that:
            causes the cooling fluid to accumulate within the channel until the cooling fluid rises to a height of the first heatsink fin structure and the second heatsink fin structure; and
            once the cooling fluid has accumulated within the channel, causes the cooling fluid to flow:
                in one direction over a top of the first heatsink fin structure; and
                in an opposite direction over a top of the second heatsink fin structure.

2. The apparatus of claim 1, wherein the inlet port comprises a plurality of inlet ports through which the cooling fluid enters the cold plate cover.

3. The apparatus of claim 1, wherein the outlet port comprises a plurality of outlet ports through which the cooling fluid exits the cold plate cover.

4. The apparatus of claim 1, wherein:
    the channel runs through a central plane of the cold plate base; and the cold plate cover forms an outer circumferential channel that surrounds the first heatsink fin structure and the second heatsink fin structure such that the cooling fluid traverses from the channel over the first heatsink fin structure and the second heatsink fin structure to the outer circumferential channel.

5. The apparatus of claim 4, wherein the cooling fluid:
flows along at least a portion of the outer circumferential channel to the outlet port; and
exits the cold plate cover via the outlet port.

6. The apparatus of claim 1, wherein the cold plate base and the cold plate cover collectively form a cooling device; and
further comprising at least one additional cooling device that:
is thermally coupled to an additional component;
includes an additional set of heatsink fin structures that facilitate absorbing heat generated by the additional component; and
is connected to the cooling device by way of at least one tube that carries the cooling fluid between the cooling device and the additional cooling device.

7. The apparatus of claim 6, wherein:
the cooling device absorbs the heat generated by the component;
the additional cooling device absorbs the heat generated by the additional component; and
the cooling fluid cools the cooling device and the additional cooling device by:
traversing through the cooling device and the additional cooling device; and
flowing over the first heatsink fin structure, the second heatsink fin structure, and the additional set of heatsink fin structures.

8. The apparatus of claim 1, wherein the cooling fluid comprises at least one of:
a liquid refrigerant; and
water.

9. The apparatus of claim 1, the cold plate base includes a plurality of alignment pins that are oriented perpendicular to the cold plate base; and
the cold plate cover includes a plurality of alignment receptacles that, when mated with the alignment pins, serve to align the cold plate cover with the cold plate base.

10. The apparatus of claim 1, wherein the first heatsink fin structure and the second heatsink fin structure each comprise a plurality of fins that are inclined at a non-right angle relative to the cold plate base.

11. A two-phase cooling system comprising:
a circuit that includes at least one component;
a cold plate base that:
is thermally coupled to the component; and
includes a first heatsink fin structure and a second heatsink fin structure that facilitate absorbing heat generated by the component; and
forms a channel that sits between the first heatsink fin structure and the second heatsink fin structure; and
a cold plate cover that:
sits atop the cold plate base;
includes at least one inlet port and at least one outlet port that collectively enable a cooling fluid to:
enter the cold plate cover;
pass over the first heatsink fin structure and the second heatsink fin structure included on the cold plate base; and
exit the cold plate cover;
directs the cooling fluid from the inlet port to the channel;
includes an internal wall that:
causes the cooling fluid to accumulate within the channel until the cooling fluid rises to a height of the first heatsink fin structure and the second heatsink fin structure; and
once the cooling fluid has accumulated within the channel, causes the cooling fluid to flow:
in one direction over a top of the first heatsink fin structure; and
in an opposite direction over a top of the second heatsink fin structure.

12. The two-phase cooling system of claim 11, wherein the inlet port comprises a plurality of inlet ports through which the cooling fluid enters the cold plate cover.

13. The two-phase cooling system of claim 11, wherein the outlet port comprises a plurality of outlet ports through which the cooling fluid exits the cold plate cover.

14. The two-phase cooling system of claim 11, wherein:
the channel runs through a central plane of the cold plate base; and
the cold plate cover forms an outer circumferential channel that surrounds the first heatsink fin structure and the second heatsink fin structure such that the cooling fluid traverses from the channel over the first heatsink fin structure and the second heatsink fin structure to the outer circumferential channel.

15. A method comprising:
thermally coupling, to a component, a cold plate base that:
includes a first heatsink fin structure and a second heatsink fin structure that facilitate absorbing heat generated by the component; and
forms a channel that sits between the first heatsink fin structure and the second heatsink fin structure;
mating a cold plate cover with the cold plate base that is thermally coupled with the component, wherein the cold plate cover includes at least one inlet port and at least one outlet port that collectively enable a cooling fluid to:
enter the cold plate cover;
pass over the first heatsink fin structure and the second heatsink fin structure included on the cold plate base; and
exit the cold plate cover; and
directing the cooling fluid from the inlet port to the channel such that:
the cooling fluid presses against an internal wall of the cold plate cover;
the internal wall causes the cooling fluid to accumulate within the channel until the cooling fluid rises to a height of the first heatsink fin structure and the second heatsink fin structure; and
once the cooling fluid has accumulated within the channel, the cooling fluid flows:
in one direction over a top of the first heatsink fin structure; and
in an opposite direction over a top of the second heatsink fin structure.

* * * * *